United States Patent [19]

Waugh et al.

[11] Patent Number: 4,896,374
[45] Date of Patent: Jan. 23, 1990

[54] BROADBAND MONOLITHIC BALANCED MIXER APPARATUS

[75] Inventors: Raymond M. Waugh, Philipsburg; Tzu-Hung Chen, East Brunswick; Mahesh Kumar, Lawrenceville, all of N.J.

[73] Assignee: Siemens Aktiengesellschaft, Berlin and Munich, Fed. Rep. of Germany

[21] Appl. No.: 282,083

[22] Filed: Dec. 9, 1988

[51] Int. Cl.[4] .................................................. H04B 1/26
[52] U.S. Cl. ..................................... 455/326; 455/327
[58] Field of Search ............... 455/323, 326, 325, 317, 455/327, 318, 333, 302, 303; 333/25, 26, 33, 34, 117, 118, 124

[56] References Cited

U.S. PATENT DOCUMENTS

| 4,224,572 | 9/1980 | Will | 455/326 |
|---|---|---|---|
| 4,605,902 | 8/1986 | Harrington | 455/326 |
| 4,677,691 | 6/1987 | Scott | 455/326 |
| 4,731,875 | 3/1988 | Mizukami et al. | 455/327 |
| 4,751,744 | 6/1988 | Pavio, Jr. | 455/326 |
| 4,817,201 | 3/1989 | Bonato | 455/326 |

OTHER PUBLICATIONS

IEEE Trans. on Micro., vol. MTT-32, No. 3, Mar. '84, by Ayasli et al., pp. 290-295.
IEEE Trans. on Micro., vol. MTT-33, No. 12, Dec. '85, by Kanazawa et al., pp. 1548-1553.
IEEE Trans. on Micro., vol. MTT-30, No. 12, Dec. '82, by Yarman et al., pp. 2216-2222.
Microwave Jour., May 1988, by Bierig et al., pp. 251-270.
Microwave Jour., May 1988, by D. Fisher, pp. 275-292.
IEEE 1988 Micro. & Milli.-Wave Mono. Circ. Symp., by Pavio et al., pp. 71-74.
Micro. Semicond. Circ. Design, by W. A. Davis, pp. 253-263.

Primary Examiner—Benedict V. Safourek
Assistant Examiner—Curtis Kuntz
Attorney, Agent, or Firm—John Francis Moran

[57] ABSTRACT

A broadband monolithic balanced mixer employs a unidirectional active 180° hybrid. The hybrid is fabricated utilizing two active signal splitters, two all pass phase shifting networks and two active signal combiners. The all pass networks provide a controlled phase response while the absolute phase of the network varies with frequency whereby the frequency difference between the two networks remains constant at 180° over a very broad frequency range. Because the phase varies with frequency, the source and load impedance are rendered equal and resistive. Thus the above-described apparatus employs a common source FET with feedback for the signal splitter and a common gate FET for the combiner. Matching networks are used at all four ports of the active hybrid to achieve the desired match over the desired frequency ranges. The outputs of the hybrid are applied to suitable mixer circuits including FET or diode devices.

20 Claims, 3 Drawing Sheets

BROADBAND MONOLITHIC BALANCED MIXER APPARATUS

BACKGROUND OF THE INVENTION

This invention relates to balanced mixer circuits in general and more particularly to a broadband balanced mixer for microwave applications.

An extensive amount of work has been done in the field of monolithic microwave integrated circuit (MMIC) components in order to create a fully monolithic front end, as for example, for a RF receiver. This group of components has been extensively investigated in the prior art but, in any event, an area that receives little attention relates to monolithic mixers.

A primary reason is that most system performance requirements dictate balanced or double balanced mixers which use 180° hybrids. Conventional passive hybrids, using transmission lines, are physically too large at microwave frequencies to be implemented in practical monolithic applications requiring low cost and high volume. Essentially, as is known, the microwave mixer circuit converts an RF signal to an intermediate frequency (IF) signal. This intermediate frequency (IF) signal is usually chosen to fall in the range of 20-100 MHZ. The frequency is low enough to build high quality IF amplifiers relatively inexpensive and yet high enough to avoid the flicker noise that is inversely proportional to frequency (1/f noise).

The IF frequencies are obtained by injecting, in addition to the RF signal, a local oscillator (LO) or pump frequency $w_p$. The difference or IF frequency is a result of circuit non-linearities. The non-linearity effect in implementing mixer circuits is well known. In any event, double balanced mixers are also well known in the prior art and are capable of isolating both the RF signal and local oscillator voltages from the output. Hence, the term double balanced is used. In such circuits, such as the ring circuit, all diodes are pointed in the same direction, while in a star circuit two diodes point towards the central node and two away from it. In any event, the operation of such devices is well known in the art.

For an example of certain present day microwave mixers, reference is made to a text entitled "Microwave Semiconductor Circuit Design" by W. Alan Davis published by Van Nostrand Reinhold Company (1984). Pages 253-263 entitled "Mixers" describe various prior art devices.

Pursuant to these investigations, there have been many articles written concerning microwave mixing devices. See for example an article entitled "Broadband Monolithic Single and Double Ring Active/Passive Mixers" by A. M. Pavio et al. and published in the IEEE 1988 Microwave and Millimeter-Wave Monolithic Circuits Symposium. This article describes a balun topology that is implemented using monolithic technology. The balun circuit uses common gate and common source circuit techniques employing an ideal 180° phase shifter for signals present between the upper and lower halves of the balun circuit. Essentially, the article describes dual mode characteristics of distributed broadband baluns in diode mixer topologies whereby one can achieve a relatively compact monolithic circuit which is designed to operate over a frequency range several octaves wide with performance comparable with conventional passive diode mixers.

Reference is also made to an article entitled "A GaAs Double-Balanced Dual-Gate FET Mixer IC for UHF Receiver Front-End Applications" by K. Kanazawa et al. published in the IEEE Transactions on Microwave Theory and Techniques, Volume MTT-33, No. 12, December, 1985, pp. 1550-1553. In this article there is described a double balanced dual gate FET mixer for application in the front end of UHF receivers. The mixer utilizes GaAs double balanced dual gate FET's which are arranged on an integrated circuit and fabricated on the basis of a model of the dual gate FET mixer. In any event, the circuit diagram is shown in FIG. 1 of the article.

As one can ascertain from the above prior art, the structure of mixer devices for microwave application are extremely complicated and, as indicated, are very difficult to fabricate in practical monolithic IC applications requiring low cost and high volume. Furthermore, many of the systems utilize passive hybrid configurations which passive devices employ transmission lines and are, as indicated, too large at microwave frequencies to be implemented in practical embodiments.

It is therefore an object of the present invention to provide an improved broadband monolithic balanced mixer which can be integrated for microwave applications.

It is a further object of the present invention to provide a broadband monolithic balanced mixer which is small in size, which provides high isolation and where the output of the mixer can be directly coupled to additional circuitry.

SUMMARY OF THE INVENTION

A broadband monolithic balanced mixer apparatus for use within the microwave frequency ranges, comprising, an active hybrid means having one input adapted to receive an RF signal and another input adapted to receive a local oscillator (LO) signal to provide at first and second outputs a combined LO and RF signal, said active hybrid means having a first active signal splitter having an input coupled to said one input for receiving said RF signal and having first and second outputs, a second active signal splitter having an input coupled to said another input for receiving said LO signal, said second splitter having first and second outputs, a first active signal container having a first input coupled to said first output of said first signal splitter and having a second input and an output, a second active signal combiner having a first input coupled to said second output of said first splitter and having a second input and an output, a first all pass network having an input and an output terminal, with said input coupled to said first output of said second splitter and with said output coupled to said second input of said first combiner, a second all pass network having an input and an output, with the input of said second all pass network coupled to said second output of said second splitter and with the output of said second all pass network coupled to the second input of said second combiner, wherein the output of said first and second combiners each provide an RF/LO signal of a different phase with respect to one another, and mixing means coupled to said outputs of said first and second combiners to provide at an output an IF signal being of a frequency equal to the difference between said RF and LO signal frequencies and substantially free of said RF and LO signals.

DETAILED DESCRIPTION OF THE FIGURES

Figure 1:
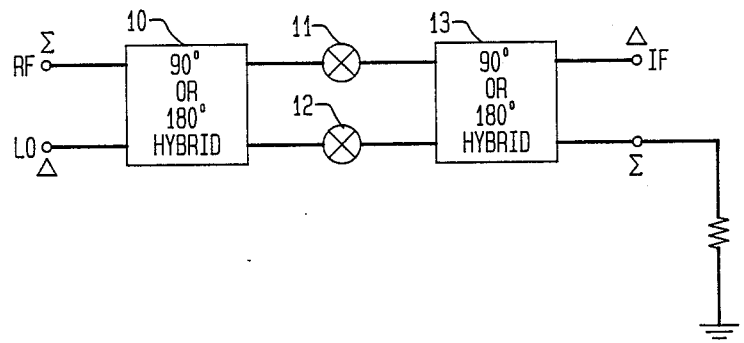
FIG. 1 is a block diagram of a balanced mixer which may employ FETs or diodes and representative of the prior art.

Referring to FIG. 1, there is shown a prior art balanced mixer configuration. Essentially a balanced mixer consists of two single mixers connected in parallel with one signal, either the RF or LO, applied in phase and the other signal applied 180° out of phase at the mixer's inputs. Hence, referring to FIG. 1 there is shown an RF signal and an LO signal which are applied to two ports of a 90° or 180° hybrid 10. The hybrid 10 is a passive device and many examples of such hybrids are well known in the art.

The two outputs from the hybrid, which are either 90° or 180° out of phase with one another, are applied to inputs of non-linear devices as 11 or 12. Such devices as 11 and 12, for example, can be FET or diode mixing circuits.

The outputs of the mixers are respectively coupled to input ports of an output hybrid 13 which also may perform a 90° or 180° phase shift. The output of hybrid 13 develops the IF signal at one port and the sum signal, designated by sigma ($\Sigma$), at the other port. Thus, as one can ascertain at the output of an FET mixer, as for example 11 and 12, another 180° hybrid 13 is required to combine the output signals. This output hybrid is not needed for diode mixers where diodes are connected in opposite polarity as will be explained.

Figure 2A:
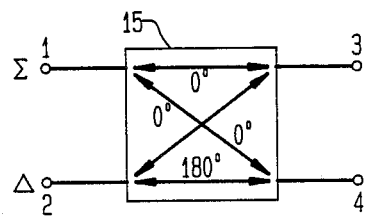
FIG. 2A is a schematic representation of an ideal 180° hybrid bidirectional circuit.
Figure 2B:
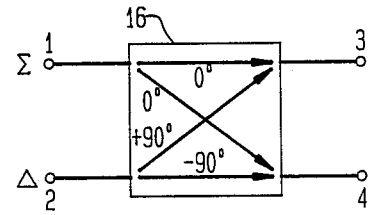
FIG. 2B is a schematic representation of a 180° hybrid unidirectional circuit.

Referring to FIG. 2A, there is shown an ideal 180° hybrid which is a four port, bidirectional circuit. The schematic representation of such a circuit is shown in FIG. 2A and designated by reference numeral 15. In any event, for a typical mixer a four port unidirectional circuit, as shown in FIG. 2B, is required. In a 180° hybrid, as the hybrid 16 of FIG. 2B, two signals (RF and LO) are applied at the sum (sigma) and difference (delta) ports 1 and 2 respectively. The signals appearing at ports 3 and 4 consist of both RF and LO signals. Signals applied at the sigma port 4 consist of both RF and LO signals. Signals applied at sigma port (port 1) are in phase and signals applied at the delta port (port 2) are 180° out of phase between ports 3 and 4.

A unidirectional active 180° hybrid with these properties can be fabricated with two active splitters, two all pass phase shifting networks, and two active combiners, as will be explained in regard to FIG. 3.

Figure 3:
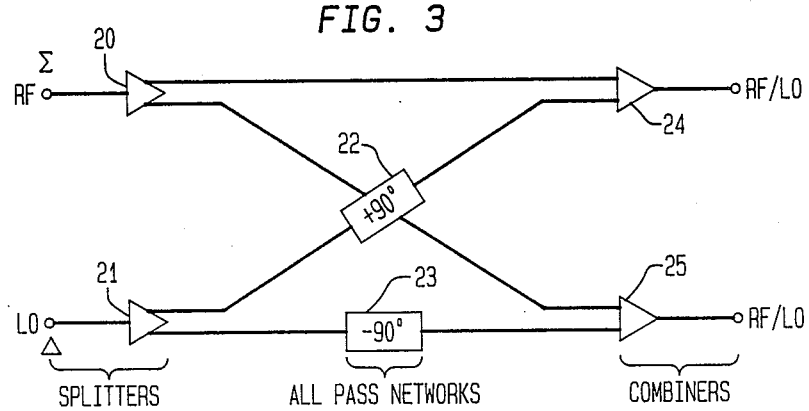
FIG. 3 is a block diagram of a unidirectional active 180° hybrid according to this invention.

As shown in FIG. 3, the RF signal is applied to an input port of a power or signal splitter 20. The signal splitter 20 has two output ports. One output port is directed to an input port of a power or signal combiner 24 while the other output is directed to an input of a signal combiner 25. The local oscillator signal is also applied to an input of a power splitter or signal splitter circuit 21. The circuit 21 also has two outputs. One output is directed through the all pass phase shifting network 22 having a +90° phase shift, and having the output coupled to the other input of the combiner 24 to produce at the output of combiner 24 the RF/LO signal. The other output of the power splitter 21 is applied to the input of another all pass network 23 having a −90° phase shift. The output of the all pass network 23 is applied as an input to the power combiner 25 to provide at the output of combiner 25 the RF/LO signal of a different phase than the signal at the output of combiner 24.

Thus, as one will understand, the circuit of FIG. 3 depicts a unidirectional active 180° hybrid which employs the properties as indicated above and utilizes two active signal or power splitters as 20 and 21, two all pass phase shifting networks as 22 and 23, and two active power or signal combiners as 24 and 25. Thus the circuit of FIG. 3 shows a unidirectional active 180° hybrid which performs the same exact functions as the hybrid configuration shown in FIG. 2B but of an entirely different structure.

Figure 4A:
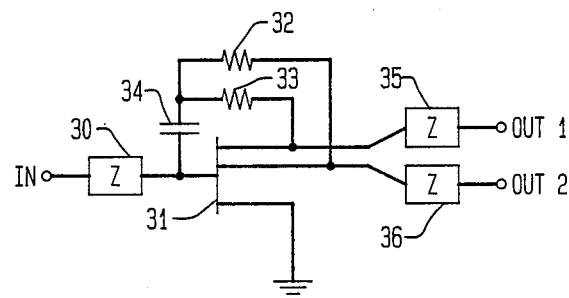
FIG. 4A is a schematic diagram of a feedback FET splitter device employed in this invention.

Referring to FIG. 4A, there is shown a feedback power splitter, as for example devices 20 and 21 of FIG. 3. The power splitter shown receives an input signal which is directed through a matching network 30. Such networks are well known in the microwave art and are used to bias the circuit as well as to provide impedance matching. The output of the matching network 30 is applied to the gate electrode of an FET 31. The FET 31 has two output source or drain electrodes and an output source or drain electrode which is coupled to a point of reference potential. The designations and interchange of the terms drain or source should be apparent to those skilled in the art as FET 31 is preferably a MESFET.

In any event, one output electrode of FET 31 is coupled via a resistor 33 and a capacitor 34 back to the gate electrode of the FET. The other output electrode is coupled via a resistor 32 and via the capacitor 34 to the gate electrode as well. This provides feedback for both output signals whereby a portion of the signal is fed back to the gate electrode to thereby linearize the response and equalize the signal splitting ability of the circuit. Each of the output electrodes are connected to suitable matching circuits as 35 and 36 which circuits also operate to apply biasing potentials to the FETs. The circuits as 35 and 36 are well known in the field of MOSFET devices. In any event, as shown in FIG. 4A, the circuit has two outputs designated as OUT 1 and OUT 2.

Figure 4B:
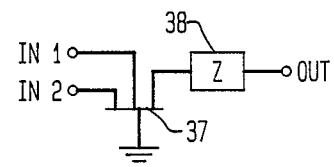
FIG. 4B is a schematic diagram depicting a common gate FET signal combiner according to this invention.

Referring to FIG. 4B, there is shown a common gate FET signal combiner which will operate as the combiners 24 and 25 of FIG. 3. There is a dual output electrode associated with the MESFET 37. The gate electrode of the MESFET 37 is directed to a point of reference potential. One output electrode, designated as IN 1, receives one input signal while the other electrode, designated as IN 2, receives the other input signal. The drain or source output electrode is coupled via a matching network 38 which provides at its output the output voltage as for example RF/LO as indicated as the outputs for combiners 24 and 25 of FIG. 3.

Figure 5:
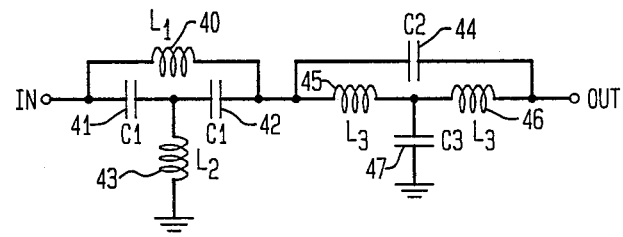
FIG. 5 is a schematic diagram of a two section all pass phase shifting network employed in this invention.

Referring to FIG. 5 there is shown a two section all pass phase shifting network which can be employed to implement the networks 22 and 23 of FIG. 3. An important factor concerning the operation of the active hybrid, as for example shown in FIG. 3, is the nature of the all pass networks, as shown in FIG. 5. These networks provide a controlled phase response while the absolute phase shift of the network varies with frequency. The phase difference between the two networks remains constant at 180° over very broadband widths. Because the phase varies with frequency, the source and the load impedances must be equal and resistive. To meet this requirement and still have a practical circuit, a common source FET with feedback is used for the splitter and a common gate FET is used for the combiner, as shown for example in FIGS. 4A and 4B. Matching networks, as networks 30, 35, 36 and 38, are then used at all four ports to achieve the desired match over the desired frequency range.

The configuration of the two section all pass phase shifting network is as follows. As seen, equal capacitors 41 and 42 are shunted by an inductor 40. The input (IN) is applied between the junction of capacitor 41 and inductor 40. The junction between capacitors 41 and 42 is returned to the point of reference potential via the inductor 43. The output of the first filter section which is represented by the junction between inductor 40 and capacitor 42 is directed to the second section which is the analog of the first section. As can be seen, the second section consists of equal series inductors 45 and 46 which are shunted by capacitor 44. The junction between inductors 45 and 46 is returned to ground through capacitor 47 with the output taken at the junction between capacitor 44 and inductor 46 (OUT).

In any event, the network shown in FIG. 5 possesses a transfer function having a constant resistance. The LC all pass network has a resistance of unity at any frequency within the range. Therefore, the amplitude tracking between the two paths, as shown in FIG. 3 as filters 22 and 23, is excellent. The designed phase difference between two all pass networks, as for example 22 and 23 of FIG. 3 at desired frequencies, can be set by selecting proper values of the inductances and the capacitors. Nearly constant phase differences over very broadband frequency ranges can be achieved by simply cascading two or more all pass networks with properly chosen resonant frequencies.

As one can ascertain, the circuit is completely symmetrical and signal can flow from the input to the output or from the output to the input and hence the circuit is bidirectional. For additional information concerning the properties of such all pass networks, reference is made to an article entitled "Properties of Some Wide Band Phase Splitting Networks" published in the Proceedings of the I.R.E., February 1949 by D. G. C. Luck on pp. 147-151. In this article there is shown passive networks that produce polyphase outputs from single phase inputs over a wide frequency band. The article reviews the properties of such circuits which are useful in such networks and expressions are derived for the phase difference produced between branches as a function of frequency. The article is pertinent to certain of the all pass networks employed herein.

See also, a pending patent application entitled "Bidirectional Digital Phase Shifter Apparatus" filed on Oct. 7, 1988, Ser. No. 255,082 for M. Kumar and assigned to the assignee herein. In that application certain aspects of all pass shifting networks are also employed and described.

As one can ascertain, in utilizing the above devices for mixer circuits, the major advantages of the active unidirectional hybrid, besides being extremely small in size, is high isolation, insertion gain rather than loss, broadband width and the ability to match thus providing lower noise operation. Also, since the active hybrid has gain, buffer amplifiers can be negated in many applications.

Figure 6:
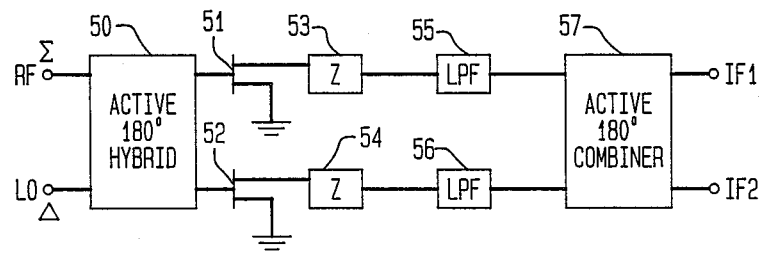
FIG. 6 is a schematic diagram of 180° balanced FET mixer according to the teachings of this invention.

Referring to FIG. 6 there is shown a circuit diagram of a balanced FET mixer which utilizes the abovenoted components. As seen in FIG. 6, the RF and LO signals are applied to a first active hybrid 50. Typical values for the RF signal are between 8.5 to 10.5 GHZ, with an IF signal from 0.5 to 2 GHZ and which can provide a DC component. These values are given only by way of example. The active 180° hybrid 50 has two output ports which are respectively directed to the gate electrodes of FETs 51 and 52. The output electrodes, as the source or drain electrodes of both FETs, are directed to a point of reference potential while the other output electrode is directed through a suitable matching network as 53 and 54, with 53 being the matching network associated with FET 51 and 54 being the matching network associated with FET 52.

The outputs of the matching networks are directed to inputs of low pass filters 55 and 56 with the outputs of the low pass filters being directed to separate inputs of an active 180° signal combiner 57. The output of the combiner 57 produces the two IF signals designated as IF 1 and IF 2. As one can ascertain, the RF and LO signals, as applied to the active hybrid 50 at the respective sigma and delta ports, operate as follows. Either the RF or the LO signal may be applied to the delta port depending on which set of spurious responses need to be rejected. The outputs of the active hybrid 50 are matched to the input of the FETs via networks 53 and 54. The low pass filters as 55 and 56 are used at the outputs of the FETs to reject RF and LO signals. The IF signals appearing at the output of the two low pass filters are 180° out of phase and they are combined through the 180° active combiner 57. The active 180° combiner 57 is depicted in FIG. 7.

Figure 7:
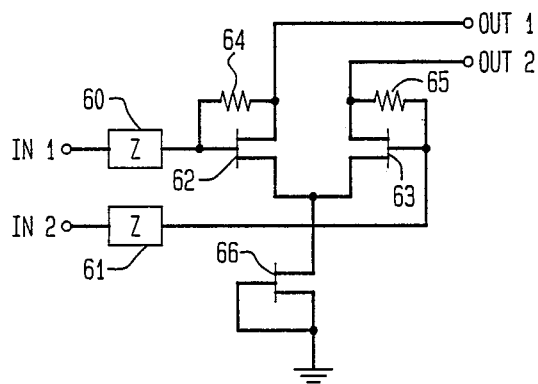
FIG. 7 is a schematic diagram showing an active 180° IF combiner circuit employed with this invention.

As can be seen from FIG. 7, the active combiner consists of a differential pair of FETs 62 and 63. The common source or drain connection between FETs 62 and 63 is directed through a constant current source as FET 66 having the source drain electrode in series between the common connected electrodes of FET 62 and 63 to a point of reference potential and having its gate electrode connected to an output electrode to form a diode configuration.

The differential FET configuration consisting of FETs 62 and 63 each employ feed back from the drain electrode or source electrode by means of resistors 64 and 65. The matching networks 60 and 61 are again employed to match the impedance characteristics of each of the devices. The input signal designated as IN 1 is applied to the input of matching network 60 while the input signal designated as IN 2 is applied to the input of matching network 61. The outputs of the matching networks are respectively coupled to the gate electrodes of FETs 62 and 63. The other output electrode of each FET as the source or drain designates a first and second output as OUT 1 and OUT 2.

The active combiner shown in FIG. 7 possesses multi functions. The combiner acts as 180° combiner, an IF amplifier and a low pass filter if proper matching networks are provided as for example networks 60 and 61. One can also DC couple to the device at the inputs to the outputs of an FET mixer and at the output if level shifting stages are provided. In addition, the circuit provides balanced IF signals so several similar stages can be cascaded.

Figure 8:
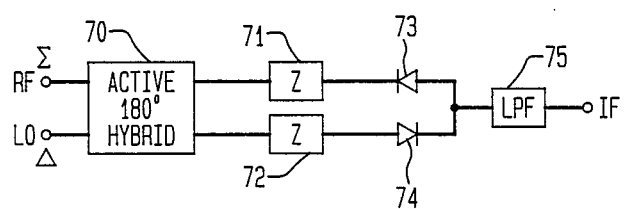
FIG. 8 is a schematic diagram of a 180° balanced diode mixer according to the invention herein.

Referring to FIG. 8 there is shown 180° balanced diode mixer. The mixer utilizes the 180° active hybrid, which is shown for example in FIG. 3, as the input hybrid designated by 70. This hybrid 70 receives the RF and LO signals at input ports designated as sigma and delta. The output of the hybrid is again directed through matching networks 71 and 72. Matching network 71 is associated with a first microwave diode 73 having its cathode coupled to the output of matching network 71 and having its anode coupled to the cathode of a second diode 74. The anode of diode 74 is coupled to the output of matching circuit 72.

As seen in FIG. 8, the anode of diode 73 is connected to the cathode of diode 74. This junction is taken as an output and is directed through the low pass filter 75 which provides at an output the IF signal. The circuit of FIG. 8 employs different matching networks as 71 and 72 to properly match each of the diodes. As indicated previously, reversing the polarity of the diodes eliminates the need for an output hybrid as was the case for the FET mixer of FIG. 6.

The low pass filter 75 is still necessary to remove any RF and LO frequencies. Due to the fact that the diode mixer does not require an output hybrid, it is considerably smaller than the above-described FET mixer. However, unlike the FET mixer, which provides conversion gain, the diode mixer suffers from conversion loss. In most other mixer specifications the two different mixer types are similar. As one will understand, the diodes employed for 73 and 74 may be Schottky diodes or PIN diodes. In any event, the most common choice for the diode is the Schottky-Barrier diode.

The above-described mixer circuits are balanced mixers and can be easily integrated utilizing MMIC techniques. They are broadband, small in size, provide high isolation while the use of the monolithic active splitter and combiner and the lumped element 180° hybrid enable total integration of the entire network. As one can ascertain, the use of the monolithic DC coupling active 180° combiner/IF amplifier, as for example shown in FIG. 7, can enable direct coupling of the IF output utilizing the above-described techniques.

We claim:

1. A broadband monolithic balanced mixer apparatus for use within the microwave frequency ranges, comprising:

an active hybrid means having one input adapted to receive an RF signal and another input adapted to receive a local oscillator (LO) signal to provide at first and second outputs a combined LO and RF signal, said active hybrid means having a first active signal splitter having an input coupled to said one input for receiving said RF signal and having first and second outputs, a second active signal splitter having an input coupled to said another input for receiving said LO signal, said second splitter having first and second outputs, a first active signal combiner having a first input coupled to said first output of said first signal splitter and having a second input and an output, a second active signal combiner having a first input coupled to said second output of said first splitter and having a second input and an output, a first all pass network having an input and an output terminal, with said input coupled to said first output of said second splitter and with said output coupled to said second input of said first combiner, a second all pass network having an input and an output, with the input of said second all pass network coupled to said second output of said second splitter and with the output of said second all pass network coupled to the second input of said second combiner, wherein the output of said first and second combiners each provide an RF/LO signal of a different phase with respect to one another, and mixing means coupled to said outputs of said first and second combiners to provide at an output an IF signal being of a frequency equal to the difference between said RF and LO signal frequencies and substantially free of said RF and LO signals.

2. The broadband monolithic balanced mixer according to claim 1 wherein said first all pass network provides a phase shift of +90° over a broadband microwave range, with said second all pass network providing a phase shift of −90° over said range, with said different phase at said combiner outputs being 180°.

3. The broadband monolithic balanced mixer according to claim 1 wherein said first and second signal splitters each comprise:

a FET device having dual output electrodes as dual drain or source electrodes, a second output electrode as a single drain or source electrode and a gate input electrode adapted to receive said RF or LO signal, with both of said dual electrodes coupled to said gate electrode via an impedance network, with a first electrode of said dual electrodes indicative of said first output and the second electrode indicative of said second output.

4. The broadband monolithic balanced mixer according to claim 3 further including a first matching network coupled to said gate electrode, a second matching network coupled to said first electrode of said dual pair and a third matching network coupled to said second electrode of said dual pair.

5. The broadband monolithic mixer according to claim 1 wherein said first and second active signal combiners each include, a FET having dual input electrodes as source or drain electrodes for receiving first and second input signals, a grounded gate electrode, and a source or drain output electrode indicative of said combiner output.

6. The broadband monolithic mixer according to claim 5 further including a matching network coupled to said output electrode of said combiner.

7. The broadband monolithic mixer according to claim 4 wherein said impedance network includes a first resistor having one terminal connected to said first electrode of said dual electrodes and the other terminal connected to one terminal of a capacitor having the other terminal connected to said gate electrode, with a second resistor connected at one terminal to said other one of said dual electrodes and the other terminal connected to said other terminal of said first resistor.

8. The broadband monolithic mixer according to claim 1 wherein said first and second all pass networks each provide a controlled phase response wherein the phase difference between the two networks remains constant over said broadband range.

9. The broadband monolithic mixer according to claim 1 wherein said mixing means comprises,
   a first microwave diode having the anode coupled to the output of said second combiner,
   a second microwave diode having the cathode coupled to the output of said first combiner, with the cathode of said first diode connected to the anode of said second diode to form an output port,
   a low pass filter having an input coupled to said output port and an output for providing said IF signal.

10. The broadband monolithic mixer according to claim 1 wherein said mixing means includes,
    a first FET having a gate electrode coupled to said output of said first combiner and having a grounded source or drain electrode, with the non-grounded source or drain electrode indicative of a first output,
    a second FET having a gate electrode coupled to said output of said second combiner and having a grounded source or drain electrode, with the non-grounded source or drain electrode indicative of a second output,
    a first low pass filter having an input coupled to said first output of said first FET and having an output,
    a second low pass filter having an input coupled to said second output of said second FET and having an output,
    an active 180° combiner having one input coupled to the output of said first low pass filter and a second input coupled to the output of said second low pass filter, said active 180° combiner having a first output for providing a first IF signal and a second output for providing a second IF signal of a different phase.

11. The broadband monolithic balanced mixer according to claim 10, wherein said active 180° combiner includes,
    first and second FET devices arranged in a differential amplifier configuration with the gate electrode of said first FET coupled to the output of said first low pass filter and with the gate electrode of said second FET coupled to the output of said second low pass filter, with the source or drain electrode of said first FET providing said first output and with the source or drain electrode of said second FET providing said second output, with said source or drain electrodes of said FETs not providing an output connected together, and
    constant current means coupled to said connected electrodes to provide a ground return for said first and second FETs.

12. The broadband monolithic balanced mixer according to claim 11 wherein said constant current means includes a third FET having the source or drain electrode connected to said connected together electrodes and having the other electrode as source or drain connected to the gate electrode.

13. The broadband monolithic mixer according to claim 3 wherein said FET is a MESFET.

14. The broadband monolithic mixer according to claim 5 wherein said FET is a MESFET.

15. The broadband monolithic mixer according to claim 10 wherein said first and second FETs are MESFETs.

16. The broadband monolithic mixer according to claim 9 wherein said first and second microwave diodes are Schottky barrier diodes.

17. The broadband monolithic mixer according to claim 11 wherein said first and second FET devices are MOSFETs.

18. The broadband monolithic mixer according to claim 12 wherein said third FET is a MOSFET.

19. The broadband monolithic mixer according to claim 11 further including a first matching network coupled to the gate electrode of said first FET and a second matching network coupled to the gate electrode of said second FET.

20. The broadband monolithic mixer according to claim 11 further including mixer means DC coupled to said first and second outputs of said active 180° combiner.

* * * * *